US008941050B1

(12) United States Patent
Nangalia et al.

(10) Patent No.: US 8,941,050 B1
(45) Date of Patent: Jan. 27, 2015

(54) PROCESSING SOLDERBRACE USING LIGHT WAVELENGTH FILTER AND A BROADBAND LIGHT SOURCE

(75) Inventors: Sundeep Nand Nangalia, Raleigh, NC (US); Rich Green, Durham, NC (US); Kyle Gilliland, Roxboro, NC (US)

(73) Assignee: Amkor Technology, Inc., Chandler, AZ (US)

( * ) Notice: Subject to any disclaimer, the term of this patent is extended or adjusted under 35 U.S.C. 154(b) by 178 days.

(21) Appl. No.: 13/608,521

(22) Filed: Sep. 10, 2012

(51) Int. Cl.
*G01J 3/50* (2006.01)

(52) U.S. Cl.
USPC .......................................... 250/226; 250/216

(58) Field of Classification Search
USPC ............... 250/226, 216, 239, 559.4; 257/528, 257/678, 704; 438/329, 799, 758, 761
See application file for complete search history.

(56) References Cited

U.S. PATENT DOCUMENTS 7,253,495 B2 * 8/2007 Sutardja ........................ 257/528

OTHER PUBLICATIONS

John J.H. Rech and Deok-Hoon Kim, "Wafer level packaging having bump-on-polymer structure," Microelectronics Reliability 43 (Feb. 14, 2003) pp. 879-894, Pergamon.
John Jackson and Alan O'Donnell, "MicroCSP™ Wafer Level Chip Scale Package," Analog Devices AN-617 Application Note, Rev. B, pp. 1-12, North, MA.
"The Chip Scale Package (CSP) 15," Intel, 2000 Packaging Databook, 15-1-15-16.
Huihua Shu, "Enhanced Polymer Passivation Layer for Wafer Level Chip Scale Package," Dissertation dated May 7, 2012, pp. 1-143, Auburn, Alabama.
Jean-Paul Clech, Ph.D., "Solder Joint Reliability of CSP Versus BGA Assemblies," SMT ESS Hybrid 2000 Conference, EPSI Inc., Jun. 27, 2000, pp. 1-8, Nuremberg, Germany.
Jui-I Yu, Rick Yu, Danial Huang, Walter Jau, James Lin, Homing Tong, and Ker-Chang Hsieh, "Effects of Photosensitive Film Sidewall Profile with Different Exposure Wavelength and Process Characteristics of Plating Bump Technology," 2006 Electronic Components and Technology Conference, IEEE, Advanced Semiconductor Engineering, Inc (ASE), pp. 1045-1049, Kaohsiung, Taiwan.

* cited by examiner

*Primary Examiner* — Que T Le
(74) *Attorney, Agent, or Firm* — McAndrews Held & Malloy

(57) ABSTRACT

Systems, methods and/or techniques for processing solderbrace using one or more light wavelength filters are described. A method of processing solderbrace material may include applying solderbrace material to a wafer, placing a light wavelength filter between the solderbrace material and a broadband light source and exposing the light wavelength filter to broadband light from the broadband light source. The light wavelength filter may block some wavelengths of light and may allow other wavelengths of light to pass through and strike the solderbrace material. In some embodiments, the light wavelength filter may be an I-Line filter that is adapted to block substantially all wavelengths of light and allow passage of I-Line wavelengths of light. In some embodiments, the light wavelength filter may be an I-Line filter that is adapted to block substantially all G-Line and H-Line wavelengths of light and allow passage of substantially all I-Line wavelengths of light.

20 Claims, 5 Drawing Sheets

(Drawbacks of Suggested Methods)

(Drawbacks of Suggested Methods)

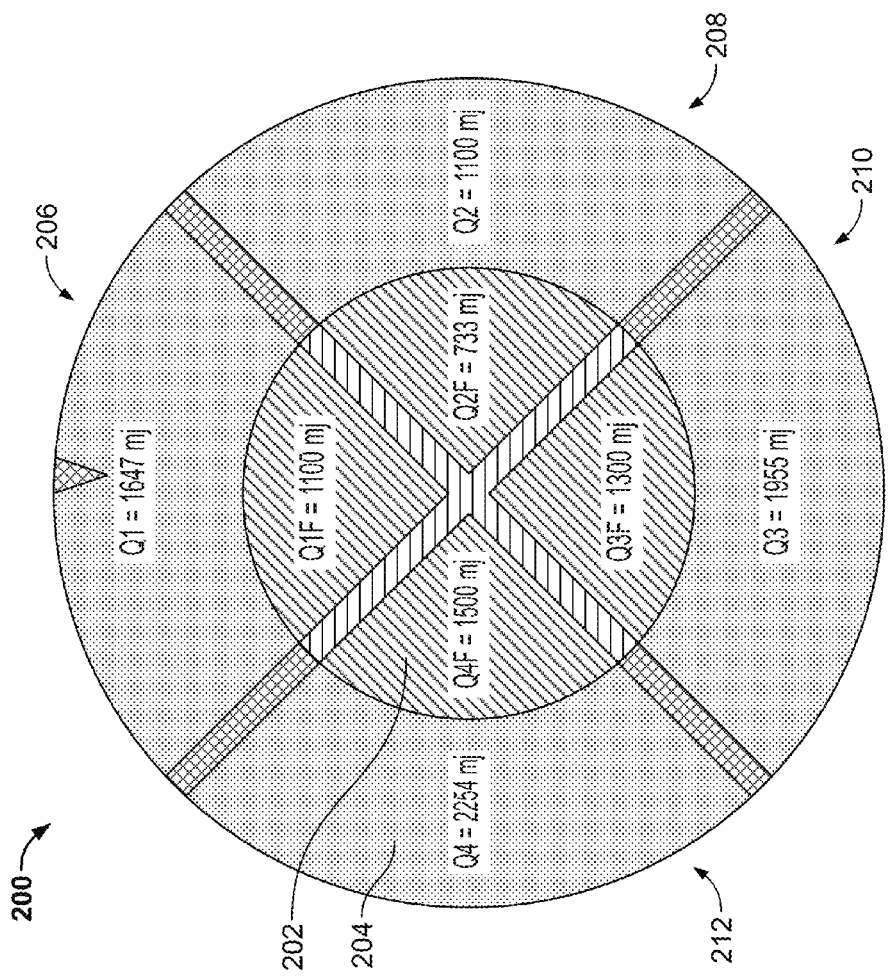

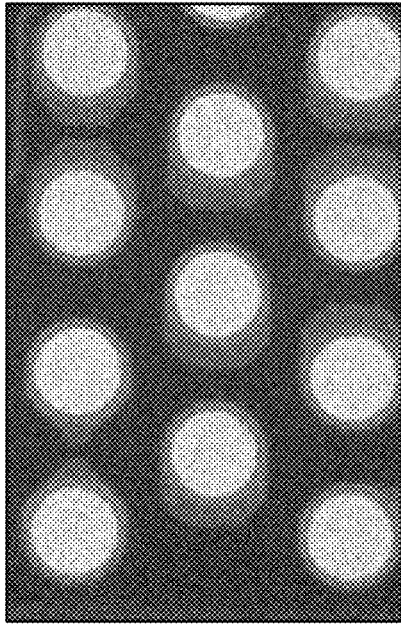
Fig. 3B
1100mj No Filter
Via Measurement 223
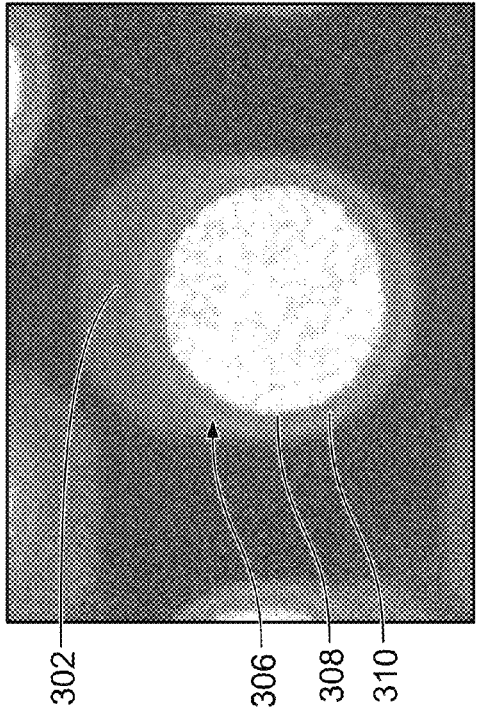
Fig. 3A
1100mj with I-Line Filter
Via Measurement 237
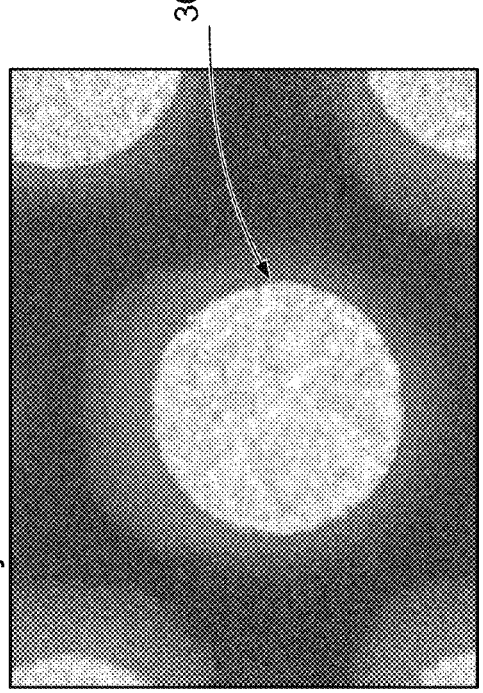

PROCESSING SOLDERBRACE USING LIGHT WAVELENGTH FILTER AND A BROADBAND LIGHT SOURCE

CROSS-REFERENCE TO RELATED APPLICATIONS

None.

FIELD

The present disclosure relates to processing solderbrace in chip scale packages, and more particularly to one or more systems, methods, routines and/or techniques for processing solderbrace using one or more light wavelength filters.

BACKGROUND

A wafer-level chip scale package (CSP) is a package for an integrated circuit that is substantially the size of the integrated circuit, which uses a wafer-level processing technique. Wafer-level CSP (WLCSP) processing techniques may apply one or more temporary photoresist (PR) layers that are removed at later stages of the process. WLCSP processing techniques may add one or more repassivation layers on the active side of the customer wafer, where at least part of the repassivation layer remains at the end of the process, as part of the final package. The PR layers and the repassivation layers are typically comprised of a photo-imageable or photosensitive material, although the PR layers and the repassivation layers may exhibit different film properties.

PR and repassivation layers may be imaged or processed to define openings or create vias. A via refers generally to a hole or an opening that extends through one or more layers of a chip package to expose an electrical contact. The openings or vias may be created by exposing the PR or repassivation layers to a certain type of light, for example ultraviolet (UV) light. A layer that is comprised of photosensitive polymer film will undergo a chemical reaction when exposed to UV light. This will allow subsequent process to strip a portion of the layer away, for example, revealing an electrical contact below.

Further limitations and disadvantages of conventional and traditional approaches will become apparent to one of skill in the art, through comparison of such systems with some aspects of the present disclosure as set forth in the remainder of the present application with reference to the drawings.

BRIEF DESCRIPTION OF THE DRAWINGS

Several features and advantages are described in the following disclosure, in which several embodiments are explained, using the following drawings as examples.

FIG. 2 depicts an illustration of a top-down view of an experiment setup that includes a wafer covered with a solderbrace material and a light wavelength filter placed over a portion of the solderbrace material.

FIG. 3A depicts an illustration of a top-down view of vias in solderbrace material that was exposed to I-Line light, in accordance with one or more embodiments of the present disclosure.

FIG. 3B depicts an illustration of a top-down view of vias in solderbrace material that was exposed to broadband light, according to current manufacturer-suggested methods.

DETAILED DESCRIPTION

Figure 1A:
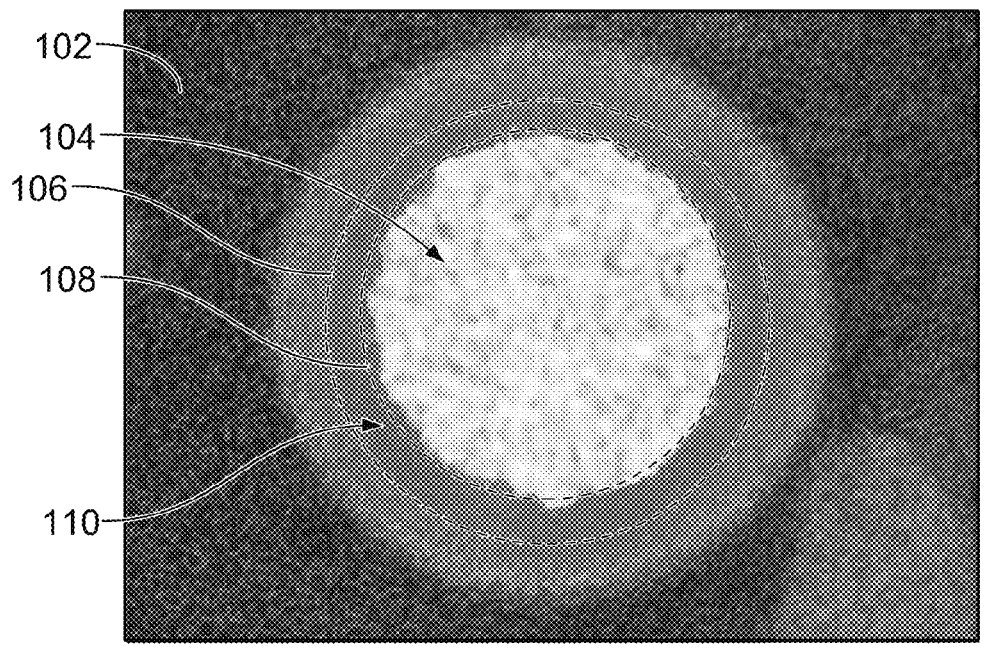
FIG. 1A depicts an illustration of a top-down view of a via in solderbrace material that was exposed to broadband light, according to current manufacturer-suggested methods.

Although techniques exist to process photo resist (PR) and repassivation layers to create vias using certain types of light, these techniques may not be adequate to process solderbrace material. Solderbrace (sb) is a unique type of repassivation that may remove the need for underfill and may be used to improve the reliability of the solder joints between the chip (integrated circuit and package) and the circuit board. Solderbrace materials have several unique properties that make them different from PR and ordinary repassivation materials, and which may make existing processing techniques particularly unsuitable for solderbrace. For example, solderbrace materials may be translucent as opposed to the existing transparent photosensitive materials. Solderbrace materials may be applied by a screen-printing machine and/or process instead of the spin-coating process used to apply existing photosensitive materials. Solderbrace material may be applied in a much thicker layer (i.e., around 20-30 um) as opposed to existing photosensitive materials (5-10 um). Solderbrace materials may cure in a different manner than existing photosensitive materials, for example during solder reflow as opposed to during high-temperature oven baking. Solderbrace materials may be a composite material, for example including Epoxy and filler particles (silica, etc.), as opposed to existing photosensitive materials that are homogeneous. Solderbrace materials have photo receptors that are very sensitive to light reflections, and the presence of dissimilar materials (i.e., Cu, PI and Si) on a wafer makes optimizing exposure conditions challenging.

These unique aspects of solderbrace may make the material behave differently to light than a PR or ordinary repassivation layer may behave. For example, current processing techniques expose existing photosensitive materials to broadband light. Broadband light refers generally to light that includes a combination of wavelengths, typically G, H and I-Line wavelengths. These techniques may work for existing photosensitive materials because these materials are capable of being tuned to work with a certain wavelength (G, H or I) while being insensitive to other wavelengths. According to several experiments performed by the applicants, solderbrace materials are much more resistant to (or even incapable of) being tuned in this manner. Some manufacturers of solderbrace advertise their materials as being sensitive to one wavelength of light (i.e., I-Line) and insensitive to other wavelengths (i.e., G and H line). However, several experiments performed by the applicants have shown these advertisements to be untrue, and therefore, it has been discovered that because of the unique properties of solderbrace material, significant benefits can be realized in solderbrace processing techniques if certain wavelengths of light are filtered out (i.e., G and H line filtered out, leaving I-Line). It should be understood that although the methods, processes, solutions and/or techniques described in this disclosure mainly describe filtering out G and H line wavelengths of light and leaving I-Line, this disclosure also contemplates other combinations of G, H and I-Line filtering, and the methods, processes, solutions and/or techniques described herein are intended to be applicable to other combinations.

The present disclosure describes one or more systems, methods, routines and/or techniques for processing solderbrace using one or more light wavelength filters. In some embodiments, the one or more wavelength filters may substantially filter out G and H line wavelengths and allow passage of I-Line wavelengths. It has been discovered, and will be shown with descriptions of experiments herein, that exposing solderbrace to filtered light results in a more stable and consistent process that is not dependent (or is far less dependent) upon variants in the process, such as the light exposure dose and the copper pad size. A more stable and consistent process may be extremely beneficial to a maker of wafer-level chip scale packages, for example because the maker may be able to vary the light dose and other variants in the process to achieve other process-related goals, while maintaining a predictable via size.

It may be beneficial to start with a description of drawbacks that have been discovered when solderbrace material is exposed to broadband light (G, H and I-Line wavelengths). Again, it is restated that manufacturers of solderbrace material advertise their materials as being sensitive to one wavelength of light (i.e., I-Line) and insensitive to other wavelengths (i.e., G and H line). However, experiments performed by the applicants have shown that when solderbrace material is exposed to broadband light, an overexposure/underexposure dilemma may manifest, as shown in FIGS. 1A and 1B.

Figure 1B:
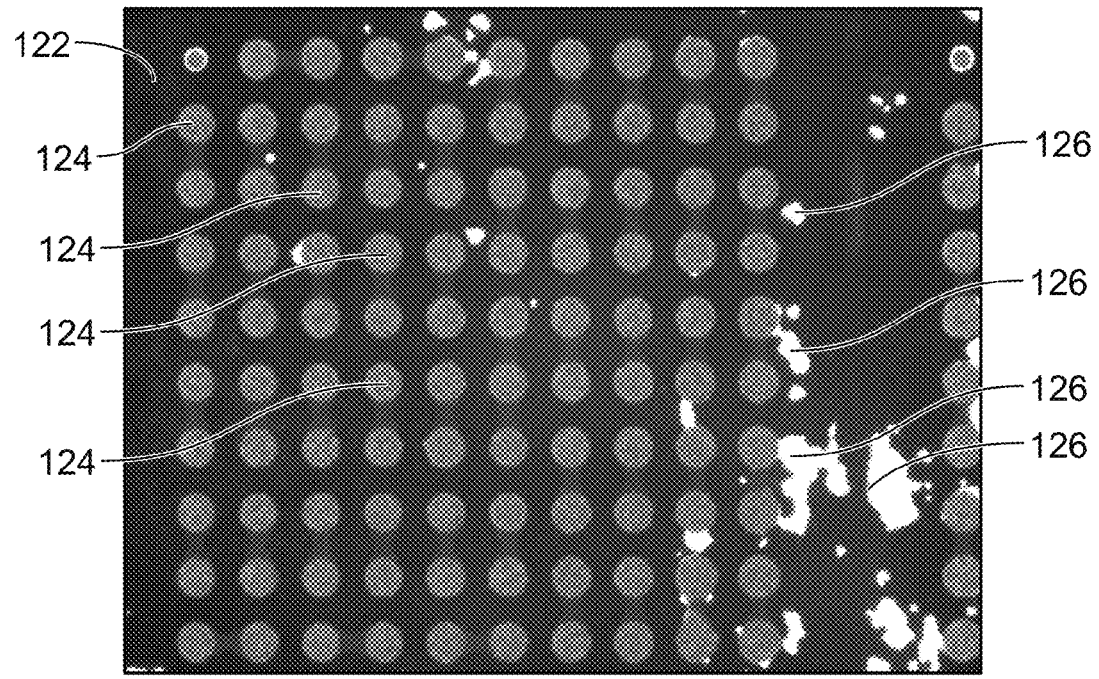
FIG. 1B depicts an illustration of a top-down view of a via in solderbrace material that was exposed to broadband light, according to current manufacturer-suggested methods.

FIGS. 1A and 1B each depict an illustration of a top-down view of a via in solderbrace material that was exposed to broadband light, according to current manufacturer-suggested methods. FIG. 1A shows a solderbrace material 102 with a via 104 that extends through the solderbrace material 102. The via 104 has an outer edge 106 and an inner edge 108. The via 104 exhibits a dark region 110 between the outer edge 106 and the inner edge 108, where the dark region may be undesirable.

FIG. 1A illustrates one drawback of current suggested methods which may be referred to as the overexposure problem. Solderbrace material is a negative acting film, meaning that the higher the dose or intensity of the light exposure, the smaller the via gets. This negative relationship exists because the solderbrace material, after it is applied to the chip, may be washed away unless it is bonded to the chip by light exposure. Therefore, the solderbrace material around the outside of the via (102) is exposed to light, while the inside of the via (104) is sheltered from exposure, for example by a chrome disc. The dark region 110 is caused by stray broadband light beams that bend around the chrome disc and start to bond solderbrace material that was intended to be washed away. When makers of wafer-level chip scale packages expose photosensitive materials to light to create vias, they may have certain expectations and/or requirements regarding the size of the via relative to the dose or intensity of the light. This expected and/or required size may be referred to as the design value. Exposing solderbrace materials to broadband light may disrupt this stability and/or predictability in the package-creation process.

Referring to FIG. 1A, the outer edge 106 may be the expected and/or required via size; however, the inner edge 108 may be the effective via size. Therefore, any thickness between the outer edge 106 and the inner edge 108 (the dark region 110) may cause a disparity between the effective via size and the expected and/or required via size, and may be undesirable. Thus, when solderbrace material 102 is exposed to broadband light of a certain intensity, the resulting via is much smaller than the expected and/or required size (the design value). In other words, the via may start to close off, which may be undesirable.

FIG. 1B illustrates another drawback of current suggested methods which may be referred to as the underexposure problem. One attempted solution to fix the overexposure problem (small via size) may be to lower the dose or intensity of the broadband light, but this leads to another problem. When lower doses of broadband light strike the solderbrace material, the solderbrace material does not bond or cure adequately to the underlying chip/substrate/wafer, which may lead to the solderbrace material delaminating (i.e., lifting, flaking off, etc.) from the underlying substrate. FIG. 1B shows solderbrace material 122 and several vias 124. FIG. 1B also shows delamination areas 126 where the solderbrace material has flaked off due to underexposure of light and inadequate curing.

Another drawback of current suggested methods is that if a maker of wafer-level chip scale packages were to discover a dose or intensity of light that were acceptable for its design processes, variations in the design process may still cause great uncertainty and/or additional steps and/or cost in the process. For example, the light exposure dose may be highly pattern dependent. When vias are created, a pattern may be used to guide the shape of the via. This pattern may be referred to as a copper pad, and can best be seen in FIG. 3B (302). With current suggested methods, whenever a different pattern is used, the dose may need to be adjusted and fine-tuned. Dose adjustment and fine-tuning for each pattern adds time and cost to the process and the final product. As another example, the exposure dose may be dependent upon the strength of the lamp that emits the broadband light. The lamp strength can change over time, for example as the lamp degrades and the lamp intensity decreases from usage. This change in exposure dose again complicates the task of fine tuning the dose or intensity of broadband light that is acceptable for solderbrace material.

The present disclosure describes one or more solutions to the problems associated with current suggested methods of processing solderbrace using light. The present disclosure describes one or more systems, methods, routines and/or techniques for processing solderbrace using one or more light wavelength filters. In some embodiments, the one or more wavelength filters, when exposed to broadband light, may substantially filter out G and H line wavelengths and allow passage of I-Line wavelengths to strike the solderbrace material. In some embodiments, an I-Line filter may be used that, when exposed to broadband light, substantially blocks G and H line wavelengths and allows passage of I-Line wavelengths. It should be understood that some I-Line filters may not block 100 percent of G and H line wavelengths. For example, some I-Line filters may block around 75% of G and H line wavelengths. Other I-Line filters may block more or less than 75%. The I-Line filter may be placed between the broadband light source and the solderbrace material. In these embodiments, the solderbrace material will be exposed to either exclusively or substantially I-Line wavelengths, and the solderbrace material will be exposed to minimal or no G and H line wavelengths. In some embodiments, an I-Line filter may be used that, when exposed to broadband light, substantially blocks G and H line wavelengths and allows passage of I-Line wavelengths between 350 and 375 nm. In some embodiments, an I-Line filter may be used that, when exposed to broadband light, substantially blocks G and H line wavelengths and allows passage of I-Line wavelengths below 400 nm. In some embodiments, an I-Line filter may be used that, when exposed to broadband light, substantially blocks G and H line wavelengths and allows passage of I-Line wavelengths of about 365 nm. In some embodiments, an I-Line filter may be used that, when exposed to broadband light, substantially blocks G and H line wavelengths and allows passage of I-Line wavelengths of about 365.4 nm. It should be understood that although the methods, processes, solutions and/or techniques described in this disclosure mainly describe filtering out G and H line wavelengths of light and leaving I-Line, this disclosure also contemplates other combinations of G, H and I filtering, and the methods, processes, solutions and/or techniques described herein are intended to be applicable to other combinations.

Further embodiments, examples and/or techniques of the present disclosure will be realized with reference to the following descriptions of a number of experiments. For these experiments, an I-Line filter was placed between the broadband light source or lamp and the solderbrace material. The I-Line filter substantially blocked G and H line wavelengths and allowed passage of I-Line wavelengths to strike the solderbrace material. FIG. 2 depicts an illustration of a top-down view of an experiment setup that includes a wafer 200 covered with a solderbrace material 204 and an I-Line wavelength filter 202 placed over an inner portion of the solderbrace material 204. This type of experiment setup may be referred to as a "pinwheel" setup. As can be seen in FIG. 2, the wafer 200 is sectioned into four quarters, a first quarter 206, a second quarter 208, a third quarter 210 and a fourth quarter 212. The placement of the I-Line filter 202 in the center of the wafer 200 further sections each quarter into two parts, a Q[1-4] outer part that exposes the solderbrace material to broadband light without the I-Line filter, and a Q[1-4]F inner part that includes the filter between the broadband light source and the solderbrace material. In this particular example, one quarter of the wafer may be exposed to broadband/filtered light at a time, with each quarter receiving a different dose or intensity of light. As each quarter is exposed to light, one or more vias may be created in both the filtered (Q[1-4]F) and unfiltered (Q[1-4]) parts of the quarter. As can be seen in FIG. 2, the solderbrace material at each Q[1-4]F inner part of each quarter receives a lower effective light dose or intensity than each Q[1-4] outer part because the filter 202 reduces the intensity of the light that strikes the solderbrace material below the filter. In some examples, the filter may reduce the intensity of the light by about 40%. Referring to the second quarter 208 as one example, the dose of light that strikes the quarter is 1100 mj, and the effective dose or intensity of I-Line light that strikes the solderbrace material below the filter 202 is 733 mj.

Table 1 below shows via size results from the pinwheel experiment explained above with regard to FIG. 2. The first column of Table 1 lists the section of the wafer where the vias were formed, and the second column indicates whether the section was filtered to allow substantially only I-Line light to strike the solderbrace. The third column indicates the effective dose or intensity of the light that struck the solderbrace material, either without a filter or after passing through the I-Line filter. The next three columns show averages and ranges of inner via sizes for the vias created within the section. Referring to FIG. 1 for a moment, the inner via size is, for example, the inner edge 108. The next three columns show averages and ranges of outer via sizes for the vias created within the section. Referring to FIG. 1 for a moment, the outer via size is, for example, the outer edge 106. Finally, the last column shows the delta or difference between the inner via average and outer via average for the section. Referring to FIG. 1 for a moment, the last column could also be thought of as indicated the average dark area 110, which may be undesirable.

TABLE 1

| Section | Filtered | Dose (mj) | Inner Via Avg. (um) | Inner Via Range (um) | Via Range (um) | Outer Via Avg. (um) | Outer Via Range (um) | Via Range (um) | Delta: inner vs outer via Averages |
|---|---|---|---|---|---|---|---|---|---|
| Q1 | No | 1647 | 207 | 206-209 | 3 | 231 | 229-233 | 4 | 24 |
| Q1F | Yes | 1100 | 237 | 235-238 | 3 | 249 | 246-250 | 4 | 12 |
| Q2 | No | 1100 | 223 | 221-225 | 4 | 241 | 240-243 | 3 | 18 |
| Q2F | Yes | 733 | 243 | 242-244 | 2 | 256 | 255-257 | 2 | 13 |
| Q3 | No | 1955 | 185 | 184-186 | 2 | 213 | 211-215 | 4 | 28 |
| Q3F | Yes | 1300 | 232 | 231-233 | 2 | 244 | 243-247 | 4 | 12 |
| Q4 | No | 2254 | 176 | 175-177 | 2 | 208 | 207-210 | 3 | 32 |
| Q4F | Yes | 1500 | 230 | 227-234 | 7 | 246 | 245-247 | 2 | 16 |

As can be seen by the via size results in Table 1 above, the filtered sections (sections Q[1-4]F) exhibit significantly smaller dark areas (last column), which is desirable for at least the reasons explained above. Additionally, the filtered sections exhibit significantly larger vias, which may indicate a reduction in the problem with current suggested methods explained above, where the vias start to close off. In some examples, these results could be due to the lower effective light exposure dose, due to the filter.

Another useful observation from Table 1 above may be that, in the filtered sections, the dark areas may remain relatively small when compared to the size of the vias, for example the inner diameters of the vias. One way to see this relationship may be to compute the ratio of average dark area (last column) to average inner via diameter (fourth column). For example, for the unfiltered sections (Q[1-4]), the ratios from Table 1 are about 12%, 8%, 15% and 18%. For the filtered sections (Q[1-4]F), the ratios from Table 1 are about 5%, 5%, 5% and 7%. Therefore, wafers and/or circuits that result from the systems, methods, routines and/or techniques described herein may achieve improved dark area to via size ratios. It should be understood that the ratios described above are just one example of ratios that may result. In some embodiments, the ratios could be higher, for example, about 7% to 12%, or even higher. In some embodiments, the ratios could be lower, for example, about 2% to 5%, or even lower.

Therefore, perhaps one of the most useful observations from Table 1 above may be the comparison of sections with identical doses of effective light exposure, where one section was filtered and one was not. For example, focusing on sections Q1F and Q2, it can be seen that each of these sections was exposed to a light dose of 1100 mj. This particular comparison may be important because section Q2 may exhibit the current process of record for some makers of wafer-level chip scale packages. Additionally, as explained above, the dose or intensity of light may contribute significantly to the curing of the solderbrace material onto the wafer. If the dose or intensity is too small, the solderbrace material may flake off. Therefore, makers of wafer-level chip scale packages may be interested in discovering an improved procedure that uses the same dose of light while achieving improved via size. Analysis of sections Q1F and Q2 shows that under the same effective dose or intensity, filtered section Q1F achieves a significantly larger inner via average and outer via average than does section Q2. Additionally, filtered section Q1F achieves a significantly smaller dark area (last column). Therefore, under the same effective dose or intensity of light, the filtered section achieves larger vias with smaller dark areas, which may solve the overexposure problem explained above.

FIGS. 3A and 3B each depict an illustration of a top-down view of vias in solderbrace material that was exposed to an effective light dose of 1100 mj. FIG. 3A illustrates vias, for example via 304, in solderbrace material that was exposed to I-Line light, for example though an I-Line filter. FIG. 3B illustrates vias, for example via 306, in solderbrace material that was exposed to broadband light, according to current manufacturer-suggested methods. FIGS. 3A and 3B show the visual effects of the results described above related to sections Q1F and Q2 of Table 1. Even though both solderbrace materials in FIGS. 3A and 3B were exposed to an effective light dose of 1100 mj, via 304 of FIG. 3A is significantly larger than via 306 of FIG. 3B, especially when focusing on the inner edge 308 of via 306. The via measurements indicated in FIGS. 3A and 3B are inner via measurements, or measurements to the inner edges of the vias. Additionally, FIG. 3B (the unfiltered section) exhibits a dark region 310, for example because stray G and H lines from the broadband light are bending around the copper pad 302 and are starting to close off the via. FIG. 3A (the filtered section), on the other hand, exhibits an almost undetectable dark region because the I-Line filter allows significantly less stray exposure. The lower frames in FIGS. 3A and 3B each show a zoomed-out view showing several vias that exhibit similar results to the via exhibited in the frame above.

Another useful observation from Table 1 above may be that, with the filter in place, the light dose may be increased without significantly changing the via size. As explained above, the dose or intensity of light may contribute significantly to the curing of the solderbrace material onto the wafer. Makers of wafer-level chip scale packages may be interested in increasing the dose of the light in order to achieve better adhesion between the solderbrace material and the wafer. However, until the solutions of the present disclosure, makers would experience the overexposure problem explained above, where the via started to close off. Referring to Table 1, sections Q3F and Q4F, it can be seen that the effective dose or intensity is increased significantly above the base 1000 mj level. Q3F indicates an exposure of 1300 mj and Q4F indicates an exposure of 1500 mj. Even though the exposure levels are higher in these two sections, the via sizes are not significantly smaller than the Q1F section, and the via sizes are still significantly larger than the Q2 section (unfiltered). Additionally, even though the exposure levels are higher in sections Q3F and Q4F, the dark regions (last column) are still smaller than the Q2 section (unfiltered). Therefore, under increased doses of light, which may lead to improved bonding of the solderbrace material, makers of wafer-level chip scale packages can expect minimal closing off of the via and minimal dark areas.

Another useful observation from Table 1 above may be that, in the filtered sections, increases in dose have a lower effect on the via size than they do in the unfiltered case. As explained above, makers of wafer-level chip scale packages may have certain expectations and/or requirements regarding the size of the via. Therefore, if one element in the process may be changed to target a desired result while maintaining expected values for other results, the makers can have a more predictable and less variant process, which may be desirable. Additionally, this may allow makers to solve the drawbacks of standard suggested broadband light procedures while making minimal changes to their processes of record. For example, if makers can increased dose to achieve improved bonding while maintaining expected values for via size, this may be ideal. Referring to Table 1 above and more particularly Table 2 below, focusing on sections Q1F, Q3F and Q4F (filtered sections), it can be seen that as the dose increases from 1000 mj to 1500 mj, the via size and dark regions do not vary drastically. However, referring to sections Q1 and Q2 (unfiltered sections), shown in Table 1 above and more particularly in Table 3 below, as the dose increases by approximately the same amount, the via size and the dark regions vary significantly more than the filtered sections.

TABLE 2

| With Filter (I-Line Light) | |
| --- | --- |
| Dose | Via |
| 1100 mj | 237 um |
| 1300 mj | 232 um |
| 1500 mj | 230 um |
| Delta | 7 um |

TABLE 3

| Without Filter (Broadband Light) | |
| --- | --- |
| Dose | Via |
| 1100 mj | 223 um |
| 1647 mj | 207 um |
| Delta | 16 um |

Figure 4A:
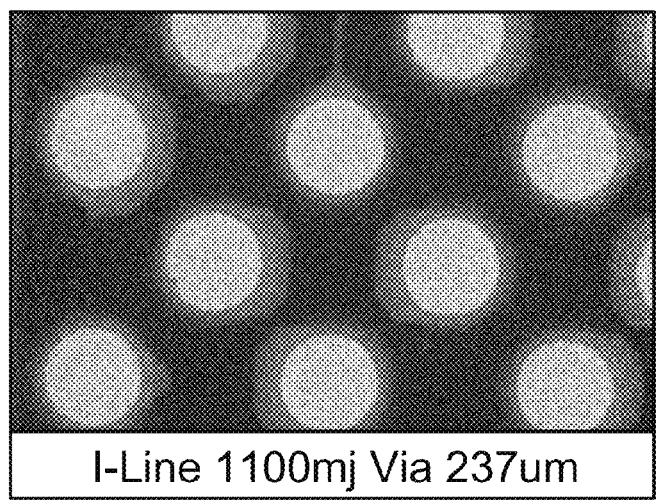
FIG. 4A depicts an illustration of a top-down view of vias in solderbrace material that was exposed to I-Line light, in accordance with one or more embodiments of the present disclosure.
Figure 4B:
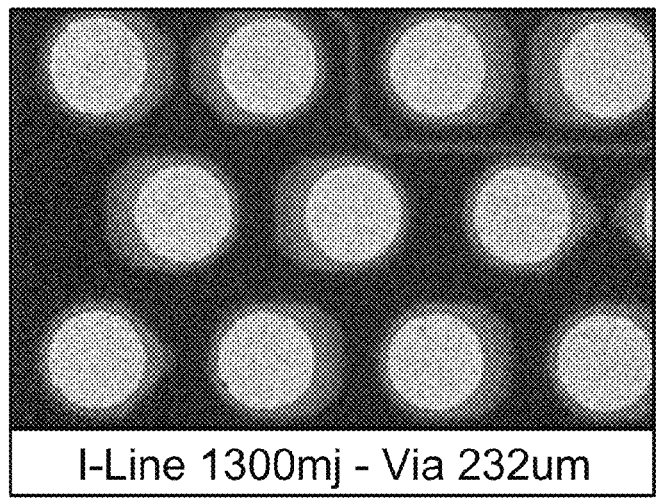
FIG. 4B depicts an illustration of a top-down view of vias in solderbrace material that was exposed to I-Line light, in accordance with one or more embodiments of the present disclosure.
Figure 4C:
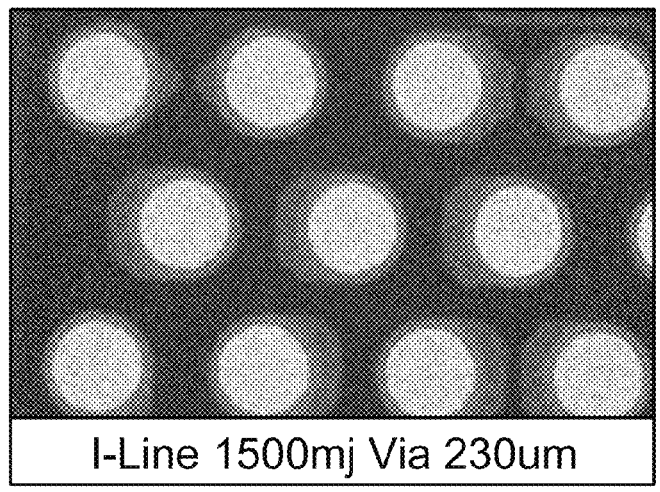
FIG. 4C depicts an illustration of a top-down view of vias in solderbrace material that was exposed to I-Line light, in accordance with one or more embodiments of the present disclosure.

FIGS. 4A-4C each depict an illustration of a top-down view of vias in solderbrace material that was exposed to filtered I-Line light, each figure exposed to different light doses. FIG. 4A illustrates vias in solderbrace material that was exposed to I-Line light at a dose of 1100 mj. FIG. 4B illustrates vias in solderbrace material that was exposed to I-Line light at a dose of 1300 mj. FIG. 4C illustrates vias in solderbrace material that was exposed to I-Line light at a dose of 1500 mj. FIGS. 4A-4C show the visual effects of the results described with respect to Tables 1 and 2. It can be seen that as the light dose increases from 1000 mj to 1500 mj, the via size does not vary drastically, ranging from 237 um to 230 um, a delta of 7 um. By comparison, referring to sections Q1 and Q2 (unfiltered sections), shown in Table 1 and 3 above, as the dose increases by approximately the same amount, the via size and the dark regions vary significantly more, ranging from 223 um to 207 um, a delta of 16 um. Additionally, referring to FIGS. 4A-4C, it can be seen that as the dose increases from 1000 mj to 1500 mj, the via itself, including the via edges, appears cleaner and more defined. The improved appearance of the via at higher doses may indicate that the solderbrace around the via has achieved improved adhesion. Therefore, makers of chip scale packages may be able to use the systems, methods, routines and/or techniques described herein to achieve improved bonding or adhesion while maintaining expected values for via size.

Using an I-Line filter, may also allow makers of chip scale packages to vary other elements of the process while still observing a minimal relationship between increases in dose and via size. For example, as explained above, when vias are created, a pattern may be used to guide the shape of the via. This pattern may be referred to as a copper pad, and can best be seen in FIG. 3B (302). With current suggested methods, whenever a different pattern is used, the dose may need to be adjusted and fine-tuned. Dose adjustment and fine-tuning for each pattern adds time and cost to the process and the final product. Because using an I-Line filter results in a minimal relationship between increases in dose and via size, a maker of chip scale packages may be able to select a standard dose amount for a variety of variable process elements, such as variable copper pad sizes. In other words, a maker may be able to implement a standard dose that is independent of design, or a standard range of doses that are closer together. This may allow makers to solve drawbacks of standard suggested broadband light procedures while making minimal changes to their processes of record.

Using an I-Line filter, may also allow makers of chip scale packages to accept variations in the process while still observing a minimal effect on via size. As one example, the strength of a lamp that generates UV or broadband light may decrease over time, for example, because the lamp degrades over time due to excessive usage. This degradation in lamp strength may lead to undesirable variations in light doses over time. With current suggested methods of using broadband light, a small change in the light dose due to lamp degradation could have a significant effect on via size and/or cause flaking of the solderbrace material. Using an I-Line filter may minimize the effects on the solderbrace and/or vias due to variations in the light dose. This may allow makers of chip scale packages to make minimal changes to their processes of record, for example, even as lamp equipment degrades.

Certain embodiments of the present disclosure may be found in one or more methods of processing solderbrace using one or more light wavelength filters. In some embodiments, the one or more wavelength filters may substantially filter out G and H line wavelengths and allow passage of I-Line wavelengths.

Figure 5:
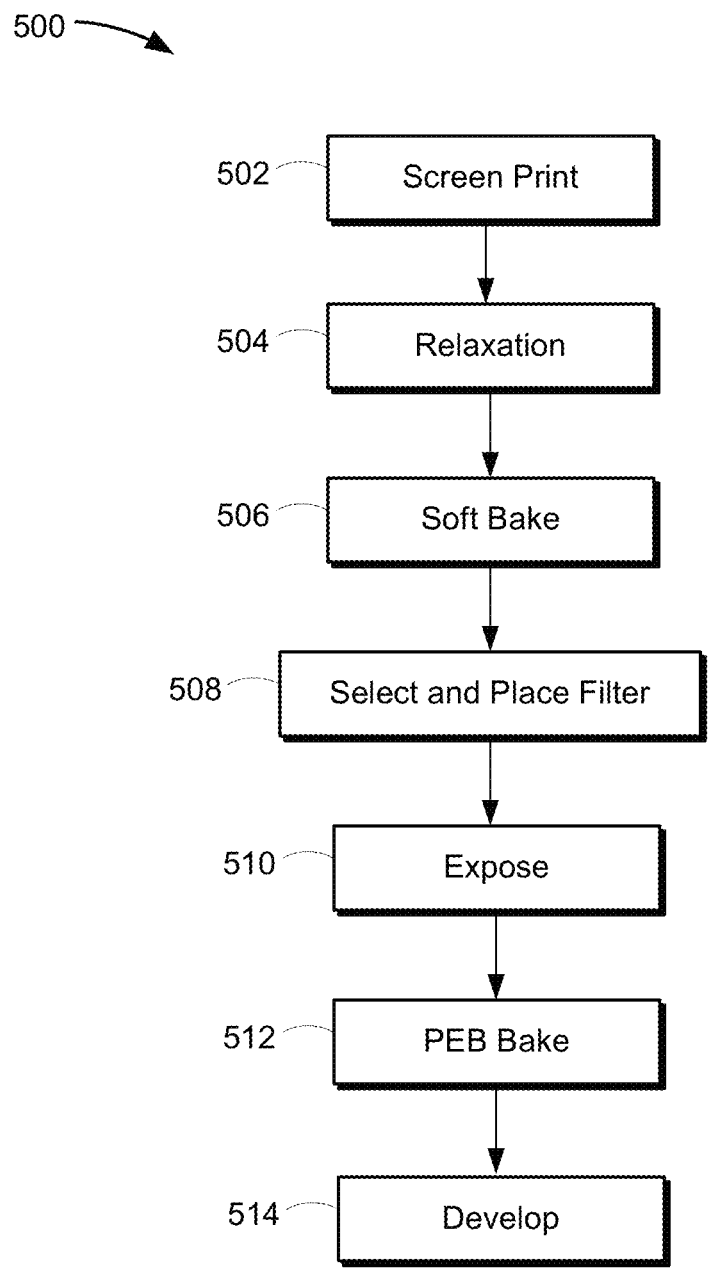
FIG. 5 depicts an illustration of a flow chart showing example steps in a method of processing solderbrace using one or more light wavelength filters, in accordance with one or more embodiments of the present disclosure.

FIG. 5 depicts an illustration of a flow chart 500 showing example steps in a method of processing solderbrace using one or more light wavelength filters, according to one or more embodiments of the present disclosure. It should be understood that, in some embodiments, one or more of the steps depicted in FIG. 5 may be performed in a different order than depicted. Additionally, in some embodiments, a method of processing solderbrace may include more or less steps than are depicted in FIG. 5. At step 502, a solderbrace material may be applied to a wafer, for example using a screen printing technique, where a coating of solderbrace material is deposited through a mesh screen. At step 504, optionally after the solderbrace material is applied, the solderbrace material may be allowed to "relax", at which time the solderbrace material may flow and self level. At step 506, the wafer may go through a soft bake, which may refer to an initial stage of curing, for example, at a lower temperature and/or for a shorter amount of time.

At step 508, one or more light wavelength filters may be selected and placed over at least a portion of the wafer. In some embodiments, the light wavelength filter(s) may substantially filter out G and H line wavelengths and allow passage of I-Line wavelengths. In some embodiments, an I-Line filter may be used that, when exposed to broadband light, substantially blocks G and H line wavelengths and allows passage of I-Line wavelengths between 350 and 375 nm. It should be understood that some I-Line filters may not block 100 percent of G and H line wavelengths. For example, some I-Line filters may block around 75% of G and H line wavelengths. Other I-Line filters may block more or less than 75%. In some embodiments, an I-Line filter may be used that, when exposed to broadband light, substantially blocks G and H line wavelengths and allows passage of I-Line wavelengths below 400 nm. In some embodiments, an I-Line filter may be used that, when exposed to broadband light, substantially blocks G and H line wavelengths and allows passage of I-Line wavelengths of about 365 nm. In some embodiments, an I-Line filter may be used that, when exposed to broadband light, substantially blocks G and H line wavelengths and allows passage of I-Line wavelengths of about 365.4 nm. It should be understood that although the methods, processes, solutions and/or techniques described in this disclosure mainly describe filtering out G and H line wavelengths of light and leaving I-Line, this disclosure also contemplates other combinations of G, H and I filtering, and the methods, processes, solutions and/or techniques described herein are intended to be applicable to other combinations.

At step 510, the wafer may be exposed to a light, for example a UV light, a broadband light and/or a filtered broadband light. In some embodiments, the wafer and an I-Line filter placed over the wafer may be exposed to broadband light, where the I-Line filter allows substantially only I-Line wavelengths to pass to the solderbrace material below. During the exposure step, the solderbrace material may be cured, and the solderbrace material may adhere more completely to the wafer. At step 512, the wafer may go through a post exposure bake (PEB-Bake) or a hard bake, usually at a higher temperature for a longer amount of time. The PEB bake may finally partially cure the solderbrace material to the wafer. The PEB bake may also evaporate remaining solvents, harden the solderbrace material and achieve proper adhesion between the solderbrace material and the wafer. At step 514, the wafer may go through a develop process where unwanted solderbrace material may be removed from the wafer and final vias may be formed. Chip scale packages that result from the method(s) described in relation to FIG. 5 may offer more stable and consistent via characteristics, for example vias that are not dependent (or are far less dependent) upon variants in the process, such as the light exposure dose and the copper pad size.

Various embodiments of the present disclosure describe one or more systems, methods and/or techniques for processing solderbrace using one or more light wavelength filters. In one or more embodiments, a method of processing solderbrace material may include applying solderbrace material to a wafer, placing a light wavelength filter between the solderbrace material and a broadband light source and exposing the light wavelength filter to broadband light from the broadband light source. The light wavelength filter may block some wavelengths of light and may allow other wavelengths of light to pass through and strike the solderbrace material. In some embodiments, the light wavelength filter may be an I-Line filter that is adapted to block substantially all wavelengths of light and allow passage of I-Line wavelengths of light. In some embodiments, the light wavelength filter may be an I-Line filter that is adapted to block substantially all G-Line and H-Line wavelengths of light and allow passage of substantially all I-Line wavelengths of light. In some embodiments, the I-Line filter may be adapted to allow passage of substantially all wavelengths of light between about 350 nm and about 375 nm. In some embodiments, the I-Line filter may be adapted to allow passage of substantially all I-Line wavelengths of light below about 400 nm. In some embodiments, the I-Line filter may be adapted to allow passage of substantially all light with a wavelength of about 365 nm. In some embodiments, the I-Line filter may be adapted to allow passage of substantially all light with a wavelength of about 365.4 nm.

In one or more embodiments of the present disclosure, the step of exposing the light wavelength filter to broadband light from the broadband light source may include tuning the broadband light source such that the effective intensity of I-Line light that strikes the solderbrace material below the light wavelength filter is about 1100 mj. In one or more embodiments of the present disclosure, the step of exposing the light wavelength filter to broadband light from the broadband light source may include tuning the broadband light source such that the effective intensity of I-Line light that strikes the solderbrace material below the light wavelength filter is about 1300 mj. In one or more embodiments of the present disclosure, the step of exposing the light wavelength filter to broadband light from the broadband light source may include tuning the broadband light source such that the effective intensity of I-Line light that strikes the solderbrace material below the light wavelength filter is about 1500 mj.

In one or more embodiments of the present disclosure, a method of forming an electrical circuit may include applying solderbrace material to a semiconductor wafer and forming vias (for example, via 304) in the solderbrace material. The forming step may include exposing a portion of the applied solderbrace material to light comprising a substantial amount of I-Line wavelength light and insubstantial amounts of G-Line and H-Line wavelengths of light. In some embodiments, the I-Line wavelength light has wavelengths of about 365 nm. In some embodiments, the I-Line wavelength light has an intensity of about 1100 mj. In some embodiments, the I-Line wavelength light has an intensity of about 1300 mj. In some embodiments, the I-Line wavelength light has an intensity of about 1500 mj.

In one or more embodiments of the present disclosure, an electrical circuit may include a semiconductor die, solderbrace material deposited on the semiconductor die and a plurality of vias (for example, via 304) formed in the solderbrace material. In some embodiments, each via of the plurality of vias has an inner diameter (for example only, inner diameter 108) an outer diameter (for example only, outer diameter 106) and a ring shaped region (for example only, ring shaped region 110) that is defined between the inner diameter and the outer diameter. Each via of the plurality of vias may be characterized by a respective ratio that is the radial width of the via's ring shaped region divided by the via's inner diameter. As an example only, the radial direction as applied to FIG. 1A may refer to invisible lines extending from the center of via 104 outward. In some embodiments, a majority of the respective ratios may be between about 2% and about 12%. In some embodiments, a majority of the respective ratios may be about 5%. In some embodiments, a majority of the respective ratios may be between about 5% and about 12%. In some embodiments, a majority of the respective ratios may be between about 2% and about 5%. In some embodiments, the inner diameter of a majority of the plurality of vias may be in the range of about 230 um to about 243 um.

Descriptions of the different advantageous embodiments have been presented for purposes of illustration and description and are not intended to be exhaustive or limited to the embodiments in the form disclosed. Many modifications and variations will be apparent to those of ordinary skill in the art. Further different advantageous embodiments may provide different advantages as compared to other advantageous embodiments. The embodiment or embodiments selected are chosen and described in order to best explain the principles of the embodiments the practical application and to enable others of ordinary skill in the art to understand the disclosure for various embodiments with various modifications as are suited to the particular use contemplated.

What is claimed is:

1. A method of processing solderbrace material, the method comprising:
    applying solderbrace material to a wafer;
    placing a light wavelength filter between the solderbrace material and a broadband light source; and
    exposing the light wavelength filter to broadband light from the broadband light source,
        wherein the light wavelength filter blocks some wavelengths of light and allows other wavelengths of light to pass through and strike the solderbrace material.

2. The method of claim 1, wherein the light wavelength filter is an I-Line filter that is adapted to block substantially all wavelengths of light and allow passage of I-Line wavelengths of light.

3. The method of claim 1, wherein the light wavelength filter is an I-Line filter that is adapted to block substantially all G-Line and H-Line wavelengths of light and allow passage of substantially all I-Line wavelengths of light.

4. The method of claim 3, wherein the I-Line filter is adapted to allow passage of substantially all wavelengths of light between about 350 nm and about 375 nm.

5. The method of claim 3, wherein the I-Line filter is adapted to allow passage of substantially all I-Line wavelengths of light below about 400 nm.

6. The method of claim 3, wherein the I-Line filter is adapted to allow passage of substantially all light with a wavelength of about 365 nm.

7. The method of claim 3, wherein the I-Line filter is adapted to allow passage of substantially all light with a wavelength of about 365.4 nm.

8. The method of claim 2, wherein the step of exposing the light wavelength filter to broadband light from the broadband light source includes tuning the broadband light source such that the effective intensity of I-Line light that strikes the solderbrace material below the light wavelength filter is about 1100 mj.

9. The method of claim 2, wherein the step of exposing the light wavelength filter to broadband light from the broadband light source includes tuning the broadband light source such that the effective intensity of I-Line light that strikes the solderbrace material below the light wavelength filter is about 1300 mj.

10. The method of claim 2, wherein the step of exposing the light wavelength filter to broadband light from the broadband light source includes tuning the broadband light source such that the effective intensity of I-Line light that strikes the solderbrace material below the light wavelength filter is about 1500 mj.

11. A method of processing solderbrace material, the method comprising:
- applying solderbrace material to a wafer;
- placing a light wavelength filter between the solderbrace material and a broadband light source;
- exposing the light wavelength filter to broadband light from the broadband light source, wherein the light wavelength filter blocks some wavelengths of light and allows other wavelengths of light to pass through and strike the solderbrace material; and
- blocking a portion of light that passes through the light wavelength filter utilizing a metal pad.

12. The method according to claim 11, wherein the metal pad causes a portion of the solderbrace material to not be struck by light.

13. The method according to claim 11, wherein the metal pad comprises copper.

14. The method according to claim 12, comprising bonding the solderbrace material to the wafer in regions that are exposed to light at wavelengths that pass through the light wavelength filter.

15. The method according to claim 12, comprising forming vias by removing solderbrace material in regions that were not struck by light.

16. The method according to claim 11, wherein the solderbrace material comprises epoxy with filler particles.

17. The method according to claim 11, comprising baking the wafer to cure the solderbrace material.

18. The method according to claim 17, wherein the filler particles comprise silica.

19. The method according to claim 11, comprising performing a post-exposure bake to the wafer after being exposed to light at wavelengths that pass through the light wavelength filter.

20. A method of processing solderbrace material, the method comprising:
- applying solderbrace material to a wafer;
- placing a light wavelength filter between the solderbrace material and a broadband light source;
- exposing the light wavelength filter to broadband light from the broadband light source;
- blocking a portion of light that passes through the light wavelength filter utilizing a metal pad; and
- removing solderbrace material in regions that were not struck by light.

* * * * *